US012640346B2

(12) United States Patent
Bhowmick et al.

(10) Patent No.: US 12,640,346 B2
(45) Date of Patent: May 26, 2026

(54) SYSTEMS AND METHODS FOR REDUCING REFLECTED POWER ASSOCIATED WITH AN HF RF GENERATOR EFFICIENTLY

(71) Applicant: Lam Research Corporation, Fremont, CA (US)

(72) Inventors: Ranadeep Bhowmick, San Jose, CA (US); Alexei Marakhtanov, Albany, CA (US); Felix Leib Kozakevich, Sunnyvale, CA (US); John Holland, San Jose, CA (US); Bing Ji, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 30 days.

(21) Appl. No.: 18/835,299

(22) PCT Filed: Dec. 21, 2022

(86) PCT No.: PCT/US2022/053720
§ 371 (c)(1),
(2) Date: Aug. 1, 2024

(87) PCT Pub. No.: WO2023/149960
PCT Pub. Date: Aug. 10, 2023

(65) Prior Publication Data
US 2025/0140526 A1     May 1, 2025

Related U.S. Application Data

(60) Provisional application No. 63/306,983, filed on Feb. 4, 2022.

(51) Int. Cl.
*H01J 37/32* (2006.01)

(52) U.S. Cl.
CPC ............................. *H01J 37/32183* (2013.01)

(58) Field of Classification Search
None
See application file for complete search history.

(56) References Cited

U.S. PATENT DOCUMENTS 9,502,221 B2 * 11/2016 Valcore, Jr. .......... G05B 19/418
12,142,461 B2 * 11/2024 Coumou ............. H01J 37/3299
2004/0222184 A1 11/2004 Hayami et al.
2008/0135519 A1 * 6/2008 Koshiishi .......... H01J 37/32082
700/266

(Continued)

OTHER PUBLICATIONS

ISR & WO PCT/US2022/053720, dated May 2, 2023, 8 pages.

*Primary Examiner* — Srinivas Sathiraju
(74) *Attorney, Agent, or Firm* — Polygon IP, LLP

(57) ABSTRACT

A method for reducing reflected radio frequency (RF) power is described. The method includes receiving a voltage signal from an output of a match. The method further includes dividing the voltage signal into a plurality of bins and identifying a bin from the plurality of bins that includes a zero crossing. The bin is associated with a frequency of a high frequency (HF) signal. The method also includes applying a fixed multiplier to the frequency of the HF signal to generate a plurality of offsets. The method includes operating an HF RF generator according to the plurality of offsets during a time period in which the voltage signal is positive or negative.

20 Claims, 6 Drawing Sheets

(Plasma Tool)

(56)                References Cited

U.S. PATENT DOCUMENTS

| | | | | |
|---|---|---|---|---|
| 2009/0278512 A1* | 11/2009 | Karlicek | H01J 37/32183 | |
| | | | 323/208 | |
| 2013/0327272 A1* | 12/2013 | Augustyniak | H01J 37/32917 | |
| | | | 118/712 | |
| 2015/0002020 A1 | 1/2015 | Boston | | |
| 2015/0028744 A1* | 1/2015 | Valcore, Jr. | H01J 37/3299 | |
| | | | 315/111.21 | |
| 2015/0032245 A1* | 1/2015 | Valcore, Jr. | H01J 37/32935 | |
| | | | 700/121 | |
| 2016/0005573 A1* | 1/2016 | Valcore, Jr. | H01J 37/32981 | |
| | | | 315/111.21 | |
| 2016/0172162 A1* | 6/2016 | Fong | H05H 1/46 | |
| | | | 315/111.21 | |
| 2016/0322207 A1* | 11/2016 | Howald | H01J 37/32183 | |
| 2018/0025930 A1* | 1/2018 | Augustyniak | H01L 21/68771 | |
| | | | 438/798 | |
| 2018/0261432 A1 | 9/2018 | Ashida | | |
| 2019/0157039 A1* | 5/2019 | Riggs | G06F 1/12 | |
| 2020/0075290 A1 | 3/2020 | Kawasaki et al. | | |
| 2020/0090948 A1* | 3/2020 | Yanagawa | H01J 37/32091 | |
| 2020/0111652 A1* | 4/2020 | Wu | H01J 37/32183 | |
| 2020/0411289 A1* | 12/2020 | Radomski | H01J 37/32174 | |
| 2021/0013009 A1* | 1/2021 | Oliveti | H01J 37/32183 | |
| 2021/0319980 A1* | 10/2021 | Bhowmick | H01J 37/32174 | |
| 2022/0005674 A1* | 1/2022 | Radomski | H01J 37/32174 | |
| 2022/0165543 A1 | 5/2022 | Howald et al. | | |
| 2022/0165545 A1* | 5/2022 | Burry | H01J 37/32174 | |
| 2022/0199366 A1* | 6/2022 | Bhowmick | H01J 37/32091 | |
| 2023/0049104 A1* | 2/2023 | Burry | H01J 37/32174 | |
| 2023/0059495 A1* | 2/2023 | Marakhtanov | H01J 37/32568 | |
| 2023/0081542 A1* | 3/2023 | Kozakevich | H01J 37/32577 | |
| | | | 333/17.3 | |
| 2023/0145567 A1* | 5/2023 | Guo | H01J 37/32449 | |
| | | | 315/111.21 | |
| 2023/0187189 A1* | 6/2023 | Jung | C23C 16/509 | |
| | | | 219/121.59 | |
| 2023/0215694 A1* | 7/2023 | Marakhtanov | H03K 3/37 | |
| 2023/0230804 A1* | 7/2023 | Bhowmick | H01L 21/67109 | |
| | | | 315/111.21 | |
| 2023/0245874 A1* | 8/2023 | Marakhtanov | H01J 37/32165 | |
| | | | 315/111.21 | |
| 2023/0274914 A1* | 8/2023 | Marakhtanov | H01J 37/32165 | |
| | | | 361/234 | |
| 2023/0298857 A1* | 9/2023 | Bhowmick | H01J 37/32183 | |
| | | | 315/111.21 | |
| 2023/0317414 A1* | 10/2023 | Marakhtanov | H01J 37/32183 | |
| | | | 315/111.21 | |
| 2023/0360886 A1* | 11/2023 | Coumou | H01J 37/3299 | |
| 2024/0152114 A1* | 5/2024 | Guo | H01J 37/32183 | |
| 2024/0186112 A1* | 6/2024 | Bhowmick | H01J 37/32155 | |
| 2024/0355585 A1* | 10/2024 | Burry | H01J 37/32174 | |
| 2025/0118534 A1* | 4/2025 | Bhowmick | H01J 37/32935 | |
| 2025/0140526 A1* | 5/2025 | Bhowmick | H01J 37/32174 | |
| 2025/0166969 A1* | 5/2025 | Bhowmick | H01J 37/32146 | |
| 2025/0210309 A1* | 6/2025 | Bhowmick | H01J 37/32183 | |

* cited by examiner

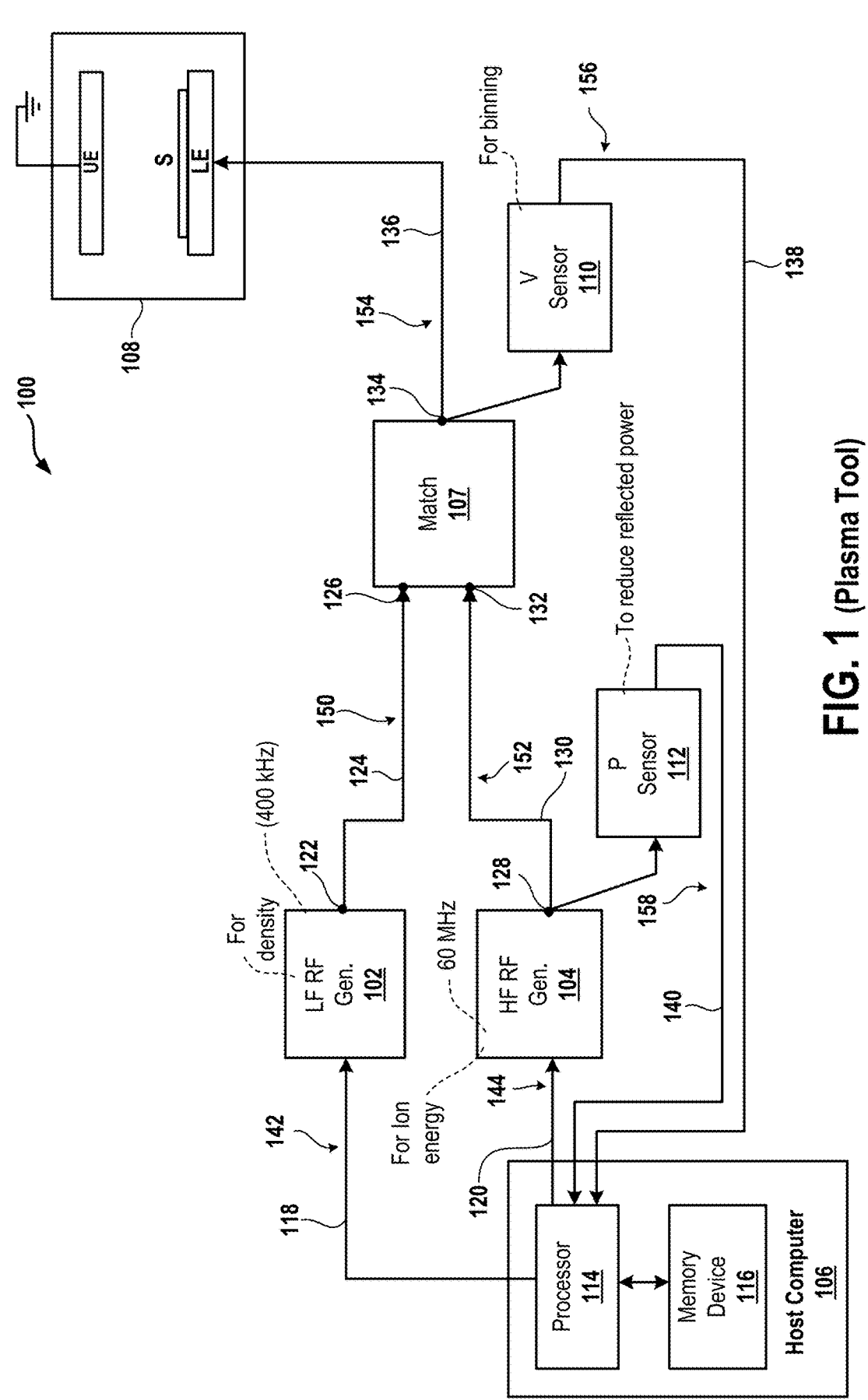
FIG. 1 (Plasma Tool)

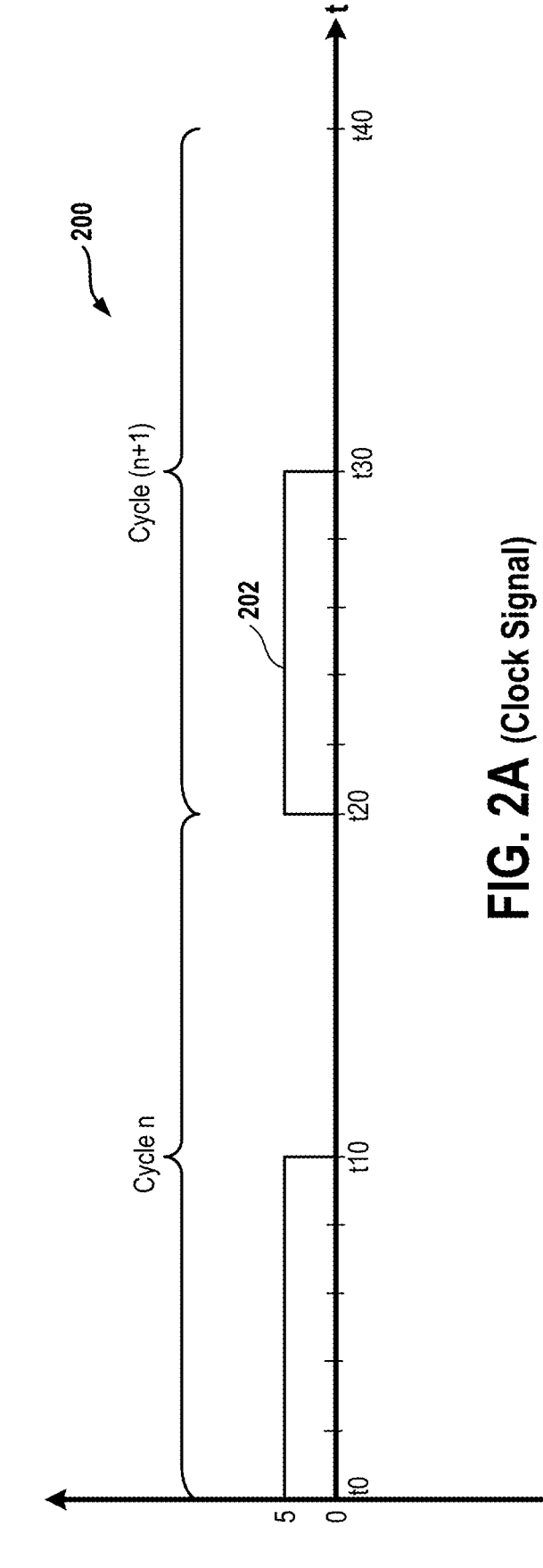
FIG. 2A (Clock Signal)

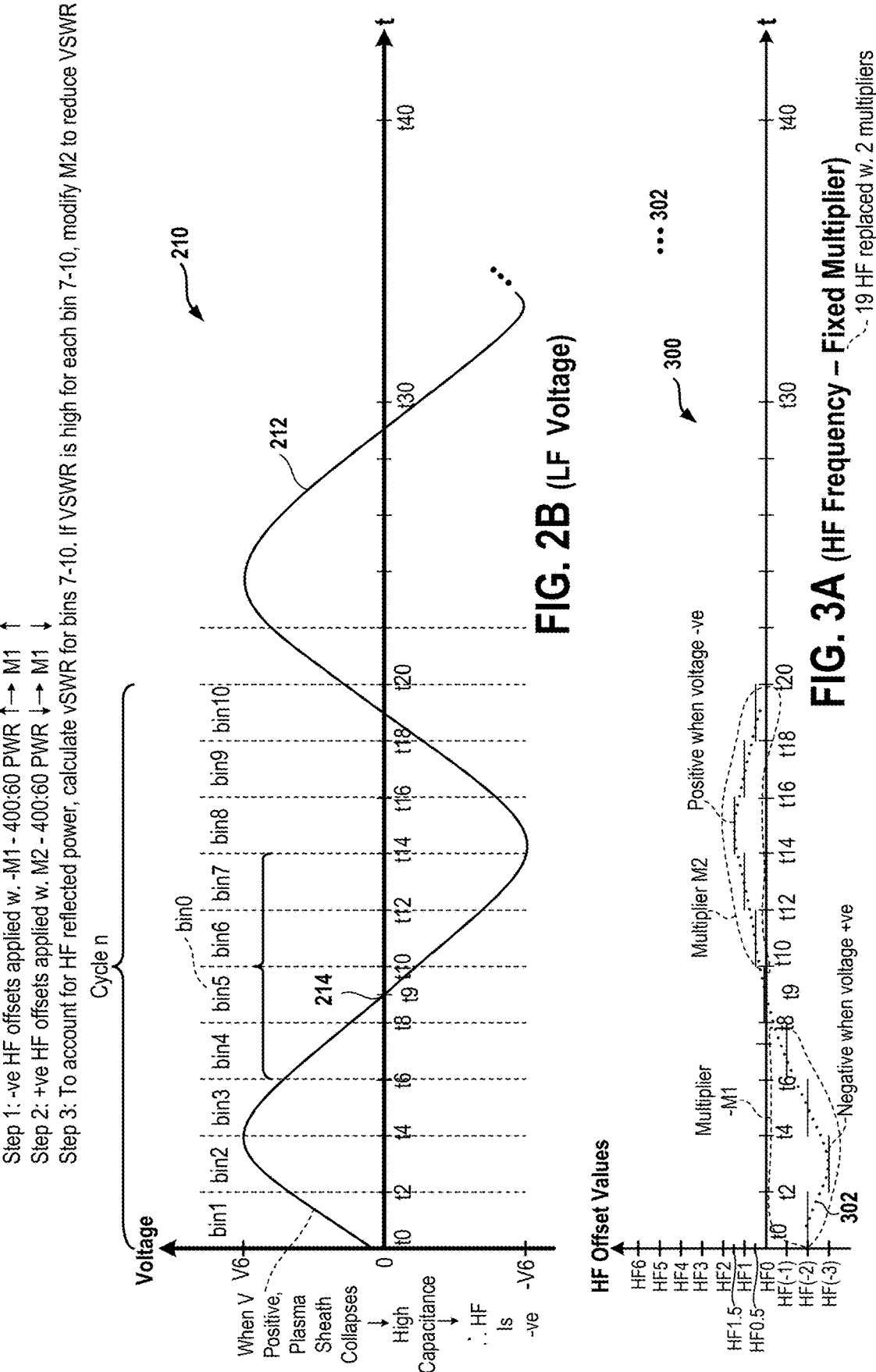
Step 1: -ve HF offsets applied w. -M1 - 400:60 PWR ↑ → M1 ↑
Step 2: +ve HF offsets applied w. M2 - 400:60 PWR ↓ → M1 ↓
Step 3: To account for HF reflected power, calculate vSWR for bins 7-10. If VSWR is high for each bin 7-10, modify M2 to reduce VSWR
FIG. 2B (LF Voltage)
FIG. 3A (HF Frequency – Fixed Multiplier)
19 HF replaced w. 2 multipliers

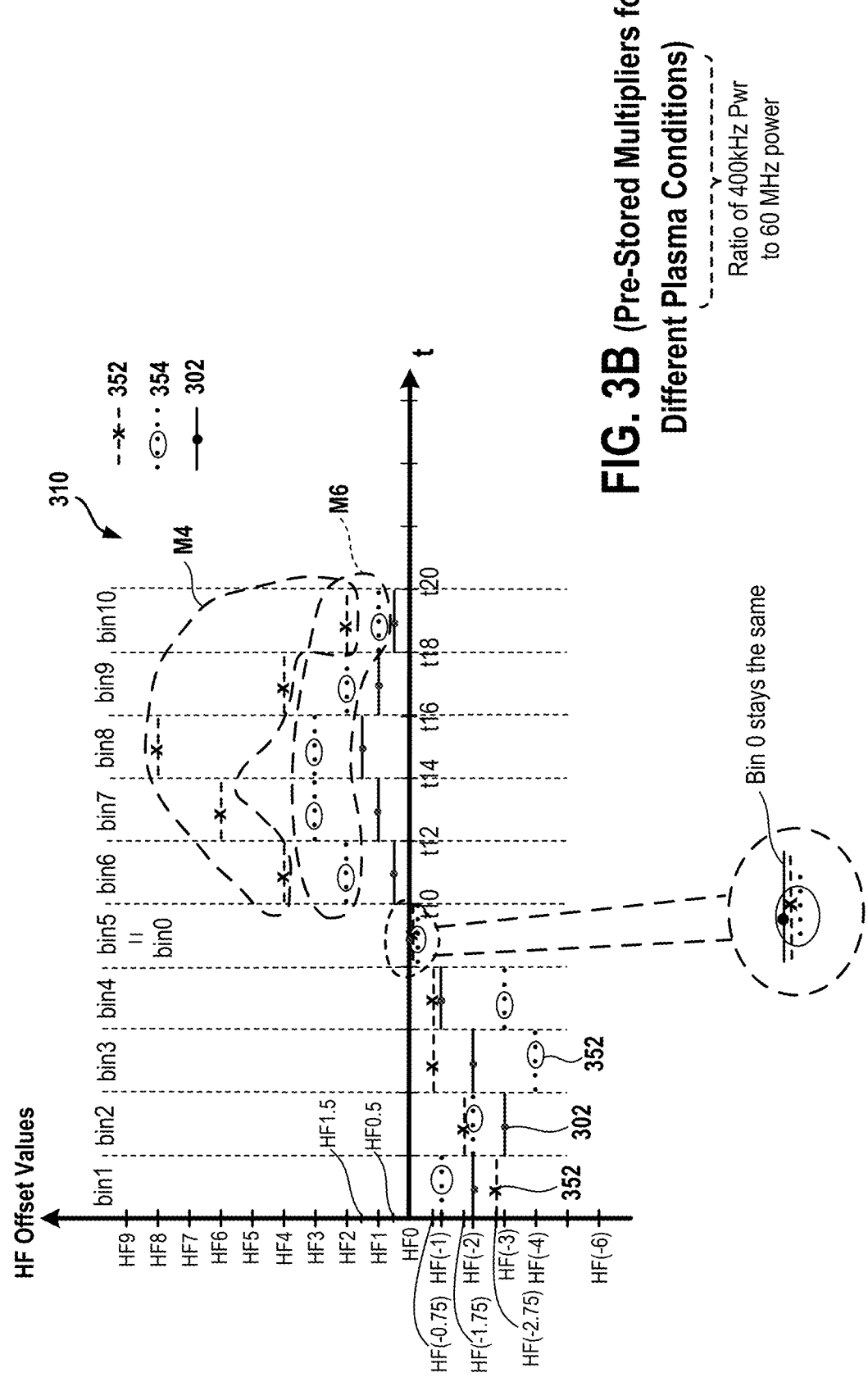
FIG. 3B (Pre-Stored Multipliers for Different Plasma Conditions)

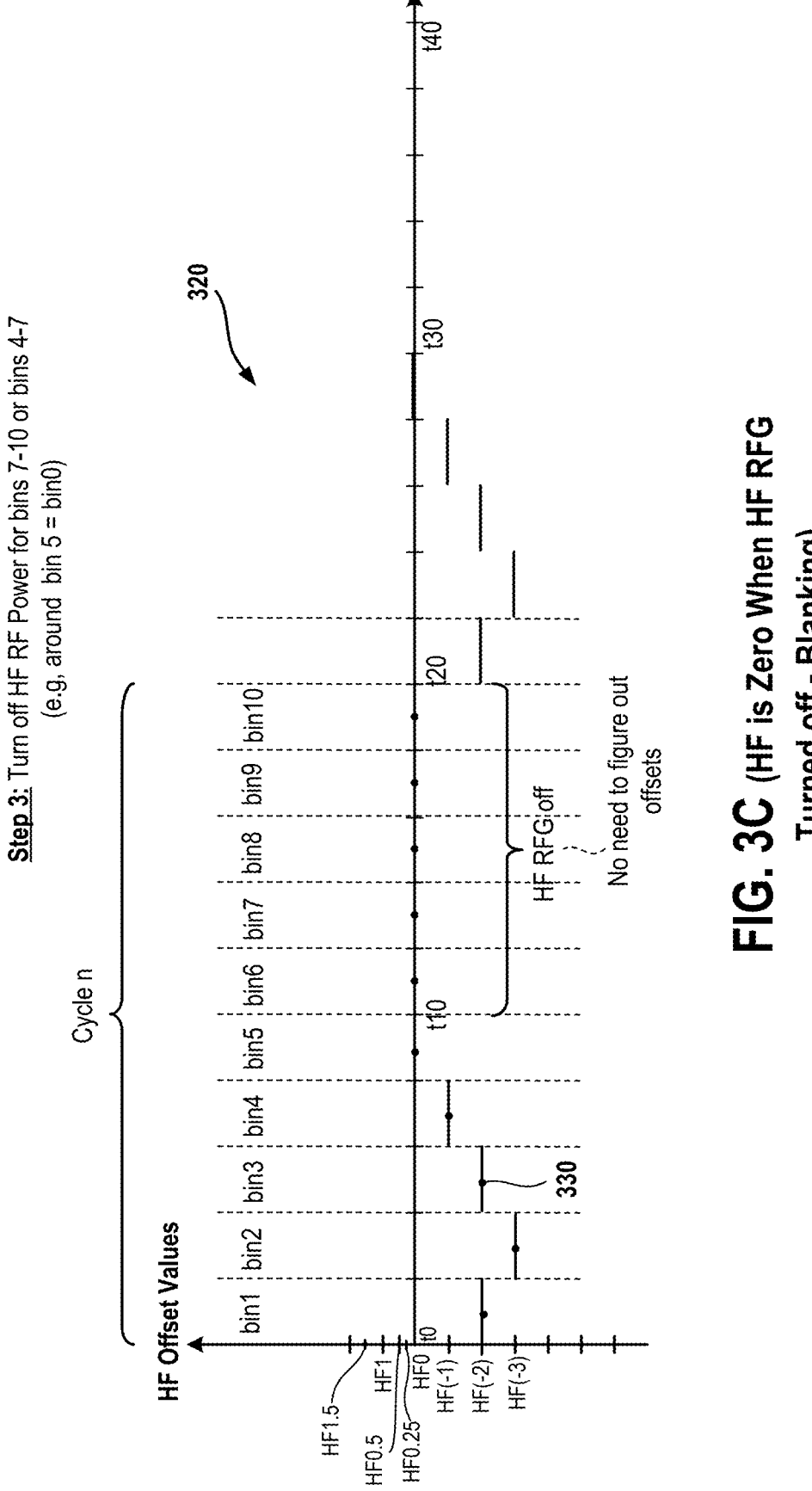
FIG. 3C (HF is Zero When HF RFG Turned off - Blanking)

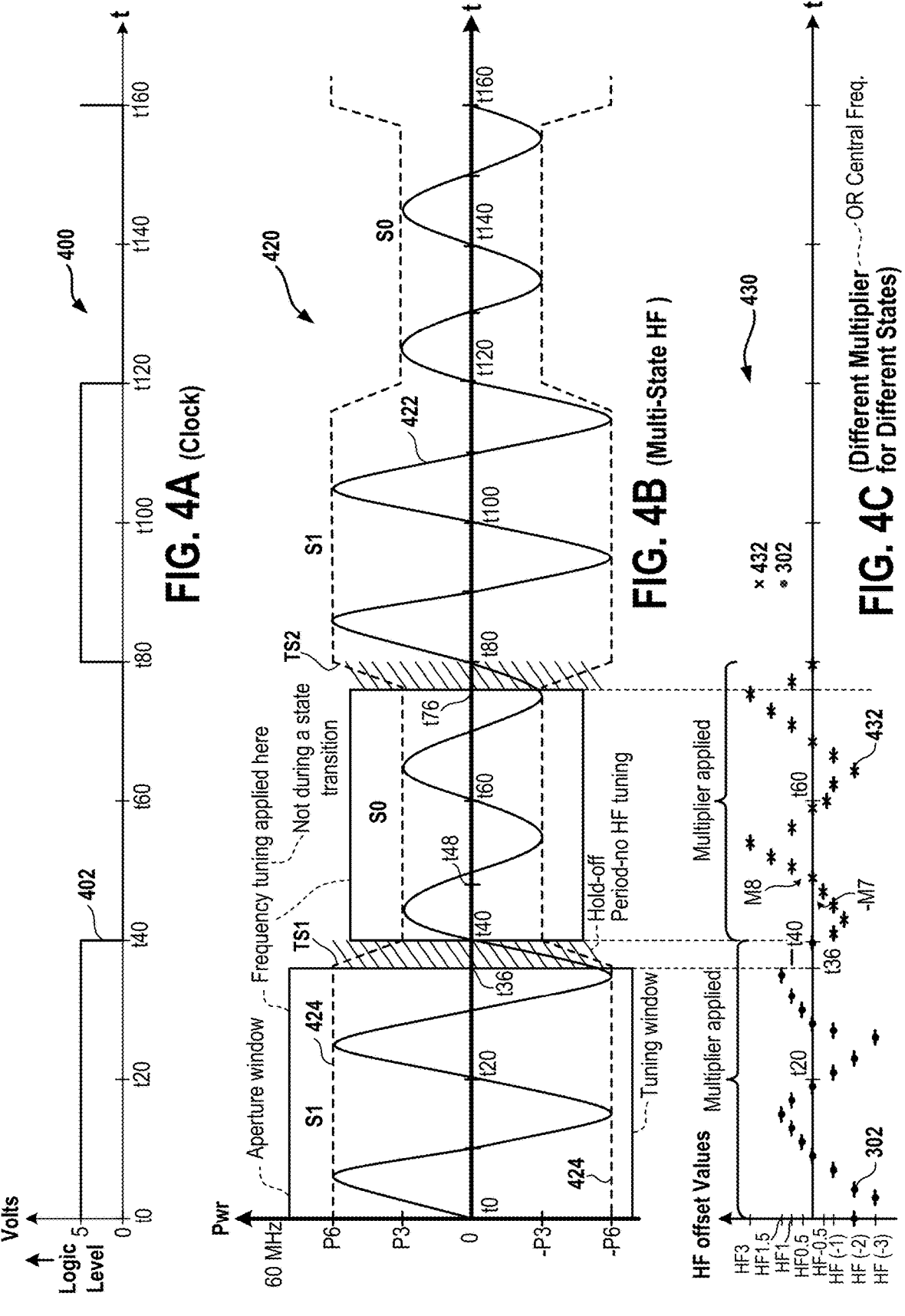
FIG. 4A (Clock)
FIG. 4B (Multi-State HF)
FIG. 4C (Different Multiplier for Different States)

1

SYSTEMS AND METHODS FOR REDUCING REFLECTED POWER ASSOCIATED WITH AN HF RF GENERATOR EFFICIENTLY

CLAIM OF PRIORITY

This application is a national stage filing of and claims priority, under 35 U.S.C. § 371, to PCT/US22/53720, filed on Dec. 21, 2022 and titled "SYSTEMS AND METHODS FOR REDUCING REFLECTED POWER ASSOCIATED WITH AN HF RF GENERATOR EFFICIENTLY", which claims the benefit of and priority, under 35 U.S.C. § 119 (e), to U.S. Provisional Patent Application No. 63/306,983, filed on Feb. 4, 2022, and titled "SYSTEMS AND METHODS FOR REDUCING REFLECTED POWER ASSOCIATED WITH AN HF RF GENERATOR EFFICIENTLY", all of which are incorporated by reference herein in their entirety.

FIELD

The embodiments described in the present disclosure relate to systems and methods for reducing reflected power associated with a high frequency (HF) radio frequency (RF) generator efficiently.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A plasma tool includes one or more radio frequency (RF) generators. The RF generators are coupled to a plasma chamber in which a wafer is placed. The RF generators supply RF signals to the plasma chamber. When process gases are supplied to the plasma chamber, plasma is generated within the plasma chamber and the plasma is used to process the wafer.

However, it is desirable that the processing of the wafer is controlled to achieve desired results. In addition, it is desirable that the wafer be processed in an efficient manner.

It is in this context that embodiments described in the present disclosure arise.

SUMMARY

Embodiments of the disclosure provide systems and methods for reducing reflected power associated with a high frequency (HF) radio frequency (RF) generator efficiently. It should be appreciated that the present embodiments can be implemented in numerous ways, e.g., a process, an apparatus, a system, a piece of hardware, or a method on a computer-readable medium. Several embodiments are described below.

In one embodiment, a method for reducing reflected RF power is described. The method includes receiving a voltage signal from an output of a match coupled to a low frequency (LF) RF generator and an HF RF generator. The method further includes dividing the voltage signal into a plurality of bins and identifying a bin from the plurality of bins that includes a zero crossing. The bin is associated with a frequency of an HF RF signal generated by the HF RF generator. The method also includes applying a first fixed multiplier to the offset frequency of the HF RF signal to generate a plurality of negative offsets and applying a second fixed multiplier to the frequency of the HF RF signal to generate a plurality of positive offsets. The method includes operating the HF RF generator according to the plurality of negative offsets during a time period in which the voltage signal is positive and operating the HF RF generator according to the plurality of positive offsets during a time period in which the voltage signal is negative.

In an embodiment, a controller for reducing reflected RF power is described. The controller includes a processor that receives a voltage signal from an output of a match coupled to an LF RF generator and an HF RF generator. The processor divides the voltage signal into a plurality of bins and identifies a bin from the plurality of bins that includes a zero crossing. The bin is associated with a frequency of an HF RF signal generated by the HF RF generator. The processor also applies a first fixed multiplier to the frequency of the HF RF signal to generate a plurality of negative offsets and applies a second fixed multiplier to the frequency of the HF RF signal to generate a plurality of positive offsets. The processor operates the HF RF generator according to the plurality of negative offsets during a time period in which the voltage signal is positive and operates the HF RF generator according to the plurality of positive offsets during a time period in which the voltage signal is negative. The controller includes a memory device coupled to the processor.

In one embodiment, a plasma system for reducing reflected RF power is described. The plasma system includes an LF RF generator that generates an LF RF signal and an HF RF generator that generates an HF RF signal. The plasma system further includes a match coupled to the LF RF generator and the HF RF generator. The match receives the LF RF and HF RF signals to output a modified RF signal. The plasma system includes a controller coupled to the LF RF generator, the HF RF generator, and the match. The controller receives a voltage signal from an output of the match, divides the voltage signal into a plurality of bins, and identifies a bin from the plurality of bins that includes a zero crossing. The bin is associated with a frequency of an HF RF signal generated by the HF RF generator. The controller also applies a first fixed multiplier to the frequency of the HF RF signal to generate a plurality of negative offsets and applies a second fixed multiplier to the frequency of the HF RF signal to generate a plurality of positive offsets. The controller operates the HF RF generator according to the plurality of negative offsets during a time period in which the voltage signal is positive and operates the HF RF generator according to the plurality of positive offsets during a time period in which the voltage signal is negative.

Some advantages of the herein described systems and methods include processing a substrate in an efficient manner. Instead of determining a high frequency value for each bin to reduce power reflected towards the HF RF generator, multipliers are used during processing of the substrate. By applying the multipliers in this manner, the power reflected towards the HF RF generator is reduced quickly to process the substrate efficiently.

Additional advantages of the herein described systems and methods include using a preset, which includes HF offset values generated based on pre-stored multipliers. There is no need to determine HF offset values during processing of the substrate for some of the bins to reduce high frequency reflected power of plasma. Rather, the preset is used to reduce the reflected power and process the substrate efficiently.

Further advantages of the herein described systems and methods include applying an HF offset value of zero during some of the bins. There is no need to apply a positive or a negative multiplier during these bins. As such, a multiplier of zero is applied during these bins. This further increases efficiency in reducing the power reflected towards the HF RF generator.

Advantages of the herein described systems and methods include applying different multipliers during different states of an RF signal, such as an HF RF signal or an LF RF signal. By applying the different multipliers during the different states, different processes can be controlled in different manners. For example, during a state S1, which is a state having a high power level, an etch process is controlled by applying a first multiplier. During a state S0, which is a state having a low power level, a deposition process is controlled by applying a second multiplier.

Also, additional advantages of the herein described systems and methods include not applying one or more multipliers during a transition state of an RF signal, such as an HF RF signal or an LF RF signal. Instead, the one or more multipliers are applied during a steady state, such as the state S1 or the state S0, of the RF signal. During the transition state, power values of the RF signal change more frequently compared to a change power values of the RF signal during the steady state. As such, it is time consuming and less efficient to apply one or more multipliers during the transition state. By not applying the one or more multipliers during the transition state, inefficiencies in processing the substrate are reduced by reducing an amount of time of application of the one or more multipliers.

Some other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 1 is a diagram of an embodiment of a plasma system to illustrate use of a low frequency (LF) radio frequency (RF) generator and a high frequency (HF) RF generator.

FIG. 2A is an embodiment of a graph to illustrate a clock signal.

FIG. 2B is a diagram of an embodiment of a graph that plots a voltage signal to illustrate binning.

FIG. 3A is a diagram of an embodiment of a graph to illustrate generation of HF offset values at which the HF RF generator is to be operated during processing of a substrate.

FIG. 3B is an embodiment of a graph to illustrate that different presets are applied.

FIG. 3C is a diagram of an embodiment of a graph to illustrate that a multiplier of zero is applied to the HF RF generator for a portion of a cycle of a clock signal.

FIG. 4A is an embodiment of a graph to illustrate a clock signal.

FIG. 4B is an embodiment of a graph to illustrate an RF signal that is generated by the HF RF generator.

FIG. 4C is an embodiment of a graph to illustrate that multipliers are not applied to a reference high frequency value of the HF RF generator during a hold-off period and are applied during a frequency tuning period and to further illustrate that different multipliers are applied during different states of the RF signal of FIG. 4B.

DETAILED DESCRIPTION

The following embodiments describe systems and methods for reducing reflected power associated with a high frequency (HF) radio frequency (RF) generator efficiently. It will be apparent that the present embodiments may be practiced without some or all of these specific details. In other instances, well known process operations have not been described in detail in order not to unnecessarily obscure the present embodiments.

FIG. 1 is a diagram of an embodiment of a plasma system 100 to illustrate use of a low frequency (LF) RF generator 102 and a high frequency (HF) RF generator 104. The system 100 includes the LF RF generator 102, the HF RF generator 104, a host computer 106, a match 107, and a plasma chamber 108. The plasma system 100 further includes a voltage (V) sensor 110 and a power (P) sensor 112.

As an example, the LF RF generator 102 has a frequency of operation of 400 kilohertz (kHz), or 2 megahertz (MHz). Also, as an example, the HF RF generator 104 has a frequency of operation of 27 MHz or 60 MHz. Examples of the host computer 106 includes a desktop, a laptop, a tablet, a controller, and a smart phone. An example of the match 107 is an impedance matching circuit or an impedance match or a match circuit or an impedance matching network. To illustrate, the match 107 includes a first branch circuit and a second branch circuit. Each branch circuit includes one or more match network elements. Examples of match network elements include capacitors, inductors, and resistors. An example of the plasma chamber 108 is a capacitively coupled plasma (CCP) chamber.

The host computer 106 includes a processor 114 and a memory device 116. Examples of the processor 114 include a central processing unit (CPU), an application specific integrated circuit (ASIC), and a programmable logic device (PLD). Examples of the memory device 116 include a read-only memory and a random access memory.

The plasma chamber 108 includes a lower electrode LE and an upper electrode UE. A gap is formed between the lower electrode LE and the upper electrode UE and a substrate S is placed within the gap on a top surface of the lower electrode LE for processing. An example of the substrate S includes a semiconductor wafer on which an integrated circuit is fabricated.

The processor 114 is coupled to the memory device 116. The processor 114 is coupled via a transfer cable 118 to the LF RF generator 102 and via a transfer cable 120 to the HF RF generator 104. An example of a transfer cable includes an electric cable that transfers data in a parallel manner or in a serial manner or using a universal serial bus (USB) protocol. The LF RF generator 102 has an output 122 that is coupled via an RF cable 124 to an input 126 of the match 107. Similarly, the HF RF generator 104 has an output 128 that is coupled via an RF cable 130 to an input 132 of the match 107. The match 107 has an output 134, which is coupled via an RF transmission line 136 to the lower electrode LE. The first branch circuit of the match 107 is coupled between the input 126 and the output 134, and the second branch circuit of the match 107 is coupled between the input 132 and the output 134. The upper electrode UE is coupled to a ground potential.

The V sensor 110 is coupled via a transfer cable 138 to the processor 114 and the P sensor 112 is coupled via a transfer cable 140 to the processor 114. The V sensor 110 is coupled to the output 134 of the match 134. Also, the P sensor 112 is coupled to the output 128 of the HF RF generator 104.

The processor 114 generates a recipe signal 142, which includes a low frequency and one or more power levels of an RF signal 150 to be generated by the LF RF generator 102. As an example, the low frequency is equal to the frequency of operation of the LF RF generator 102. The processor 114 sends the recipe signal 142 via the transfer cable 118 to the LF RF generator 102. Also, the processor 114 generates a recipe signal 144, which includes a high frequency and one or more power levels of an RF signal 152 to be generated by the HF RF generator 104. As an example, the high frequency is equal to the frequency of operation of the HF RF generator 104. The processor 114 sends the recipe signal 144 via the transfer cable 120 to the HF RF generator 104.

Upon receiving the recipe signal 142, the LF RF generator 102 generates the RF signal 150 having the low frequency and the one or more power levels indicated within the recipe signal 142. The LF RF generator 102 sends the RF signal 150 via the output 122, the RF cable 124, and the input 126 to the match 107. Similarly, upon receiving the recipe signal 144, the HF RF generator 104 generates the RF signal 152 having the high frequency and the one or more power levels indicated within the recipe signal 144. The HF RF generator 104 sends the RF signal 152 via the output 128, the RF cable 130, and the input 132 to the match 107.

Upon receiving the RF signal 150, the first branch circuit of the match 107 matches an impedance of a load coupled to the output 134 with an impedance of a source coupled to the input 126 to modify an impedance of the RF signal 150 to provide a first modified RF signal. An example of the load coupled to the output 134 includes the RF transmission line 136 and the plasma chamber 108. An example of the source coupled to the input 126 includes the RF cable 124 and the LF RF generator 102. Similarly, upon receiving the RF signal 152, the second branch circuit of the match 107 matches an impedance of the load coupled to the output 134 of the match 107 with an impedance of a source coupled to the input 132 of the match 107 to modify an impedance of the RF signal 152 to provide a second modified RF signal.

The match 107 combines, such as adds, the first and second modified RF signals to output a modified RF signal 154 at the output 134. The modified RF signal 154 is sent from the output 134 via the RF transmission line 136 to the lower electrode LE. When one or more process gases, such as a fluorine containing gas, an oxygen containing gas, a nitrogen containing gas, etc., are supplied to the gap between the lower electrode LE and the upper electrode UE, in addition to the modified RF signal 154, plasma is stricken or maintained within the gap. The plasma processes the substrate S. Examples of processing the substrate S include etching features within the substrate S, depositing materials on the substrate S, and cleaning the substrate S.

While the substrate S is being processed, the V sensor 110 measures a voltage at the output 134 to output a voltage signal 156 and sends the voltage signal 156 via the transfer cable 138 to the processor 114. Similarly, while the substrate S is being processed, the P sensor 112 measures power, such as delivered power or reflected power, at the output 134 to output a power signal 158 and sends the power signal 158 via the transfer cable 140 to the processor 114.

In an embodiment, the V sensor 110 is coupled at any point on the RF transmission line 136.

In one embodiment, the P sensor 112 is coupled at any point on the RF cable 130.

FIG. 2A is an embodiment of a graph 200 to illustrate a clock signal 202. As an example, the clock signal 202 is generated by the processor 114 (FIG. 1). An x-axis of the graph 200 plots time t ranging from a time t0 to a time t40. A y-axis of the graph 200 plots a voltage of the clock signal 202. The clock signal 202 transitions periodically between a logic level 1 and a logic level 0. The corresponds to 5 volts and the logic level 0 corresponds to zero volts.

The clock signal 202 transitions from the logic level 0 to the logic level 1 at the time t0 and remains at the logic level 1 from the time to to the time t10. At the time t10, the clock signal 202 transitions from the logic level 1 to the logic level 0, and remains at the logic level 0 from the time t10 to the time t20. The transitions between the logic levels 1 and 0 repeat from the time t20 to the time t40. The clock signal 202 has a cycle n from the time to to the time t20 and a consecutively following cycle (n+1) from the time t20 to the time t40, where n is a positive integer.

FIG. 2B is a diagram of an embodiment of a graph 210 that plots a voltage signal 212, such as a delivered voltage signal, to illustrate binning. As an example, the graph 210 is generated by the processor 114 (FIG. 1) upon receiving the voltage signal 212 from the V sensor 110 (FIG. 1).

The graph 210 plots the voltage signal 220 versus the time t. For example, a y-axis of the graph 210 represents a voltage of the voltage signal 220 and an x-axis of the graph 210 represents the time t. The y-axis plots multiple voltage values, starting in a positive y-direction from V0 to V6. Also, the y-axis plots multiple voltage values, starting in a negative y-direction from V0 to −V6. The voltage value V6 is greater than the voltage value V0 and the voltage value −V6 is less than the voltage value V0. To illustrate, the voltage value V0 is zero. As another illustration, the voltage value V0 is negative. As an example, the x-axis of the graph 210 represents the time t at which the voltage values of the voltage signal 212 are received by the processor 114 from the V sensor 110.

The voltage signal 212 is an example of the voltage signal 156 (FIG. 1) generated by the V sensor 110 (FIG. 1). The voltage signal 212 represents a voltage of the first modified RF signal or primarily represents a voltage of the RF signal 150 generated by the LF RF generator 102. For example, the voltage signal 212 represents the voltage of the RF signal 150. As another example, the voltage signal 212 primarily represents the voltage of the RF signal 150 and minimally represents a voltage of the RF signal 152. To illustrate, a voltage of the voltage signal 212 is a voltage of the RF signal 150. As another illustration, 90% of a voltage of the voltage signal 212 is a voltage of the RF signal 150 and the remaining 10% of the voltage of the voltage signal 212 is a voltage of the RF signal 152. The voltage signal 212 extends over multiple clock cycles of the clock signal 202 (FIG. 2A). For example, the voltage signal 212 extends from the time to to the time t20, and a time interval between the times t0 to t20 represents the cycle n of the clock signal 202. The voltage signal 212 further extends from the time t20 to the time t40, and a time interval between the times t20 to t40 represents the cycle (n+1) of the clock signal 202.

The processor 114 divides the voltage signal 212 during each cycle of the clock signal 202 into multiple bins, such as 10 or 20 bins. For example, during the cycle n, the voltage signal 212 is divided into bins 1 through 10 and during the cycle (n+1), the voltage signal 212 is divided into bins 1 through 10, and so on. To further illustrate, the processor 114 divides the voltage signal 212 during each cycle of the clock signal 202. The voltage signal 212 is divided into ten equal time intervals during each cycle, and each time interval is designated by the processor 114 as a bin.

The processor 114 extends each bin across the same time interval. For example, the bin 1 extends from the time to to the time t2, the bin 2 extends from the time t2 to the time t4, the bin 3 extends from the time t4 to the time t6, the bin 4 extends from the time t6 to the time t8, and the bin 5 extends from the time t8 to the time t10. The bin 5 is sometimes referred to herein as a bin 0. Also, the bin 6 extends from the time t10 to the time t12, the bin 7 extends from the time t12 to the time t14, the bin 8 extends from the time t14 to the time t16, the bin 9 extends from the time t16 to the time t18, and the bin 10 extends from the time t18 to the time t20.

The processor 114 identifies the bin 0 as a time interval that includes a point at which the voltage signal 212 intersects the x-axis and determines the point to be a negative zero crossing 214. For example, the processor 114 determines the point at which a voltage of the voltage signal 212 is zero and a slope of the voltage signal 212 is negative to be the negative zero crossing 214. As another example, at the negative zero crossing 214, a voltage of the voltage signal 212 is non-zero. The slope of the voltage signal 212 is negative during the time interval of the bin 0. The processor 114 identifies, such as designates, one of the bins 1 through 10 that include the negative zero crossing 214 to be the bin 0.

The bins 1 through 4 and a first portion of the bin 0 form a positive cycle of the voltage signal 212 and a second portion of the bin 0 and the bins 6 through 10 form a negative cycle of the voltage signal 212. The first portion of the bin 0 that is a part of the positive cycle of the voltage signal 212 extends for a time interval from the time t8 to a time t9 at which the negative crossing 214 occurs. Also, the second portion of the bin 0 that is a part of the negative cycle of the voltage signal 212 extends for a time interval from the time t9 to the time t10.

FIG. 3A is a diagram of an embodiment of a graph 300 to illustrate generation of HF offset values at which the HF RF generator 104 (FIG. 1) is to be operated during processing of the substrate S. When the HF RF generator 104 operates at the frequency of operation, the HF RF generator 104 generates the RF signal 152 (FIG. 1) having the HF offset values. The graph 300 is generated by the processor 114 (FIG. 1). The graph 300 plots HF offset values from a reference high frequency value HF0 of the RF signal 152 on a y-axis versus the time t. The time t is plotted on an x-axis of the graph 300. For example, the x-axis of the graph 210 is used as the x-axis of the graph 300.

The y-axis of the graph 300 plots the HF offset values from the high frequency value HF0, and the HF offset values range from HF0 to HF6 in the positive y-direction and from HF0 to HF(−3) in the negative y-direction. It should be noted that the HF offset values increase from HF0 to HF6 and decrease from HF0 to HF(−3). For example, the HF offset value HF1 is greater than the high frequency value HF0 and the HF offset value HF2 is greater than the HF offset HF1 and so on. Similarly, the HF offset value HF(−1) is less than the high frequency value HF0 and the HF offset value HF(−2) is less than the HF offset value HF(−1) and so on.

The processor 114 determines that the HF RF generator 104 operate at the reference high frequency value HF0 during the time interval of the bin 0 and so, the RF signal 152 (FIG. 1) has the high frequency value HF0 during the time interval. For example, the high frequency value HF0 is determined by the processor 114 to reduce a parameter associated with the HF RF generator 104 for the bin 0. Illustrations of the parameter and how to reduce the parameter for a bin are provided below.

The processor 114 applies a multiplier −M1 to offsetting values, which are offset from the high frequency value HF0, to generate HF offset values for the bins 1 through 4, where −M1 is a negative real number. Also, the multiplier −M1 is applied so that a first portion of a frequency signal 302 is formed by the HF offset values for the bins 1 through 4 forms a negative cycle of the frequency signal 302. To illustrate, the processor 114 multiplies the multiplier −M1 with a first offsetting value, which is offset from the high frequency value HF0, to generate the HF offset value HF(−1), multiplies the multiplier −M1 with a second offsetting value, which is an offset from the high frequency value HF0, to generate the HF offset value HF(−2), and multiplies −M1 with a third offsetting value, which is an offset from the high frequency value HF0, to generate the HF offset value HF(−3), where—the multiplier −M1 is a negative integer.

The values HF(−1), HF(−2), and HF(−3) are examples of negative offsets with respect to the reference high frequency value HF0. The multiplier −M1 is determined by the processor 114 to form the negative cycle of the frequency signal 302 and the negative cycle has an inverse shape compared to a shape of the positive cycle of the voltage signal 212. As such, the multiplier −M1 is applied to the first through third offsetting values to generate the first portion of the frequency signal 302 to have an inverse shape compared to shape of the positive cycle of the voltage signal 212. As another illustration, instead of the multiplier −M1 being an integer, the multiplier −M1 is a negative real number used to generate HF offset values for the bins 1 through 4. During a time period from the time to to the time t10 in which the voltage signal 212 has the positive cycle, sheath of the plasma collapses and becomes highly capacitive and the HF offset values for the bins 1 through 4 are controlled by the processor 114 to be negative with respect to the reference high frequency value HF0. The frequency signal 302 is illustrated using a series of dots in the graph 300.

The processor 114 controls the HF RF generator 104 to operate at HF offset value HF(−2) during the bin 1, the HF offset value HF(−3) during the bin 2, the HF offset value HF(−2) during the bin 3, and the HF offset value HF(−1) during the bin 4. For example, during one or more cycles, such as the cycle n, the cycle (n+1) and a cycle (n+2), of the clock signal 202, the processor 114 controls the HF RF generator 104 to operate at the HF offset values HF(−2), HF(−3), HF(−2), and HF(−1) for the bins 1 through 4. As another example, the processor 114 sends within the recipe signal 144 (FIG. 1) the HF offset values HF(−3), HF(−2), and HF(−1) to the HF RF generator 104. Also, the recipe signal 144 includes an identity, such as a time period, of each bin 1 through 4 and a correspondence, such as a unique relationship, between each of the bins 1 through 4 and one of the HF offset values HF(−2), HF(−3), HF(−2), and HF(−1). After receiving the recipe signal 144, the HF RF generator 104 generates the RF signal 152 having the HF offset values HF(−2), HF(−3), HF(−2), and HF(−1) according to the correspondences between the bins 1 through 4 and the HF offset values HF(−2), HF(−3), HF(−2), and HF(−1). To illustrate, the HF RF generator 104 generates the RF signal 152 having the HF offset value HF(−2) during the bin 1, the HF offset value HF(−3) during the bin 2, the HF offset value HF(−2) during the bin 3, and the HF offset value HF(−1) during the bin 4.

The processor 114 determines the multiplier −M1 to reduce, such as minimize, the parameter, such as a voltage standing wave ratio (VSWR) or reflection coefficient (Γ), associated with the HF RF generator 104 for the bin 4. For example, during the bin 4 of a cycle (n−m), the processor 114 receives the voltage signal 212 (FIG. 2B) and determines a ratio of a reflected voltage $V_r$ to a forward voltage $V_f$, where m is an integer less than the integer n. The ratio of the reflected voltage $V_r$ during the bin 4 to the forward voltage $V_f$ during the bin 4 is the reflection coefficient during the bin 4. The reflected voltage $V_r$ is reflected from the plasma chamber 108 (FIG. 1) via the RF transmission line 136, the second branch circuit of the match 107, and the RF cable 130 towards the HF RF generator 104. The forward voltage $V_f$ is voltage of the RF signal 152 supplied from the RF generator 104 via the RF cable 130, the match 107, and the RF transmission line 136 to the lower electrode LE. The forward voltage $V_f$ during the bin 4 is stored in the memory device 116 for access by the processor 144. The processor 114 determines the reflected voltage $V_r$ as a difference between a delivered voltage during the bin 4 of the voltage signal 212 and the forward voltage $V_f$ during the bin 4. The processor 114 determines the delivered voltage to be a statistical value, such as an average or a median, of voltage values of the voltage signal 212 during the bin 4. As another example, the processor 114 determines the VSWR for the bin 4 as a ratio of a first sum and a second sum. The first sum is a total of 1 and a magnitude of the reflection coefficient for the bin 4 and the second sum is a difference between 1 and the magnitude of the reflection coefficient for the bin 4. During the bin 4 of the cycle (n–m), the processor 114 multiplies the first offsetting value of the RF signal 152 with the multiplier –M1 to output the high frequency value HF(–1) and operates the HF RF generator 104 at the HF offset value HF(–1) during the bin 4 of the cycle (n–m). Upon operating the HF RF generator 104 at the HF offset value HF(–1) during the bin 4 of the cycle (n–m) and receiving the parameter during the bin 4 of the cycle (n–m), the processor 114 determines that the parameter has a lower value during the cycle (n–m) compared to a value of the parameter during a cycle (n–m–p) of the clock signal 202, where (n–m–p) is an integer less than the integer (n–m) and p is a positive integer. The value of the parameter during the cycle (n–m–p) is determined by the processor 114 when the processor 114 controls the HF RF generator 104 to operate at the HF offset value HF(–0.5) by applying another multiplier –M1' instead of the multiplier –M1. In this manner, the processor 114 determines that a value of the parameter for the cycle (n–m) is lower than a value of the parameter for the cycle (n–m–p), and therefore, determines to operate the HF RF generator 104 at the HF offset values HF(–2), HF(–3), HF(–2), and HF(–1) determined based on the multiplier –M1 instead of the multiplier –M1'.

The parameter indicates an amount of power reflected towards the HF RF generator 104 from the plasma chamber 108. For example, the power is reflected towards the HF RF generator 104 from the plasma chamber 108, the RF transmission line 136, the match 107, and the RF cable 130. The power reflected towards the HF RF generator 104 is sometimes referred to herein as high frequency reflected power.

In addition, the processor 114 modifies the multiplier M1 with a change in a plasma condition. For example, with an increase in a ratio of power of operation of the LF RF generator 102 and power of operation of the HF RF generator 104, there is an increase in a value of the multiplier M1 or an absolute value of the multiplier –M1. With a decrease in the ratio of power of operation of the LF RF generator 102 and power of operation of the HF RF generator 104, there is a decrease in the value of the multiplier M1 or the absolute value of the multiplier –M1.

By applying the multiplier –M1 for the bins 1 through 4, there is no need to determine or measure the high frequency reflected power to reduce the high frequency reflected power for the bins 1 through 3. For example, during the time interval of each bin 1 through 3, the processor 114 does not adjust corresponding offsetting values, such as the second and third offsetting values, to be applied to the reference high frequency value HF0 based on the high frequency reflected power. Rather, the same multiplier –M1 is applied to the corresponding offsetting values during the bins 1 through 3 as that applied to the first offsetting value during the bin 4. This increases efficiency in processing the substrate S.

Moreover, the processor 114 applies another, such as a different, multiplier M2 to offsetting values from the high frequency value HF0 to generate HF offset values for the bins 6 through 10, where M2 is a positive integer or a positive real number. Also, the multiplier M2 is applied so that a second portion of the frequency signal 302 formed by the HF offset values for the bins 6 through 10 forms a positive cycle of the frequency signal 302. During a time period from the time t10 to the time t20 in which the voltage signal 212 has the negative cycle, sheath of the plasma expands and becomes less capacitive and the HF offset values for the bins 6 through 10 are controlled by the processor 114 to be positive. To illustrate, the processor 114 multiplies the multiplier M2 with a fourth offsetting value, which is offset from the high frequency value HF0, to generate the high frequency value HF0.5, multiplies the multiplier M2 with a fifth offsetting value, which is offset from the high frequency value HF0, to generate the high frequency value HF1, and multiplies the multiplier M2 with a sixth offsetting value, which is offset from the high frequency value HF0, to generate the high frequency value HF1.5. To illustrate, one or more of the first, second, third, fourth, fifth, and sixth offsetting values are equal. As another illustration, one or more of the first through sixth offsetting values are different from one or more of remaining of the first through sixth offsetting values.

The HF offset values HF0.5, HF1, and HF1.5 are examples of positive offsets with respect to the high frequency value HF0. The multiple M2 is determined by the processor 114 to form the positive cycle of the frequency signal 302 and the positive cycle has an inverse shape compared to a shape of the negative cycle of the voltage signal 212. As such, the multiplier M2 is applied to the fourth through sixth offsetting values from the high frequency value HF0 to generate the second portion of the frequency signal 302 to have an inverse shape compared to shape of the negative cycle of the voltage signal 212.

The processor 114 controls the HF RF generator 104 to operate at the HF offset value HF0.5 during the bin 6, the HF offset value HF1 during the bin 7, the HF offset value HF1.5 during the bin 8, the HF offset value HF1 during the bin 9, and the HF offset value HF0.5 during the bin 10. For example, during one or more cycles, such as the cycle n, the cycle (n+1), the cycle (n+2), and so on, of the clock signal 202 following the cycle n, the processor controls the HF RF generator 104 to operate at the HF offset values for the bins 6 through 10. As another example, the processor 114 sends within the recipe signal 144 the HF offset values HF0.5, HF1, and HF1.5 to the HF RF generator 104. Also, the recipe signal 144 includes an identity, such as a time period, of each bin 6 through 10 and a correspondence, such as a unique relationship, between each of the bins 6 through 10 and one of the HF offset values HF0.5, HF1, and HF1.5. After receiving the recipe signal 144, the HF RF generator 104 generates the RF signal 152 having the HF offset values HF0.5, HF1, and HF1.5 according to the correspondences between the bins 6 through 10 and the HF offset values HF0.5, HF1, HF1.5, HF1, and HF0.5. To illustrate, the HF RF generator 104 generates the RF signal 152 having the HF offset value HF0.5 during the bin 6, the HF offset value HF1 during the bin 7, the high frequency value HF1.5 during the bin 8, the high frequency value HF1 during the bin 9, and the HF offset value HF0.5 during the bin 10.

The processor 114 determines the multiplier M2 to reduce, such as minimize, the parameter associated with the HF RF generator 104 for the bin 6. For example, during the bin 6 of the cycle (n–m), the processor 114 receives the voltage signal 212 and determines a ratio of the reflected voltage $V_r$ to the forward voltage $V_f$. The ratio of the reflected voltage $V_r$ during the bin 6 to the forward voltage $V_f$ during the bin 6 is the reflection coefficient during the bin 6. The processor 114 determines the reflected voltage $V_r$ as a difference between a delivered voltage during the bin 6 of the voltage signal 212 and the forward voltage $V_f$ during the bin 6. The processor 114 determines the delivered voltage to be a statistical value, such as an average or a median, of voltage values of the voltage signal 212 during the bin 6. The forward voltage $V_f$ during the bin 6 is stored in the memory device 116 for access by the processor 144. As another example, the processor 114 determines the VSWR for the bin 6 as a ratio of a first sum and a second sum. The first sum is a total of 1 and a magnitude of the reflection coefficient for the bin 6 and the second sum is a difference between 1 and the magnitude of the reflection coefficient for the bin 6. During the bin 6 of the cycle (n–m), the processor 114 multiplies the fourth offsetting value of the RF signal 152 with the multiplier M2 to output the high frequency value HF0.5 and operates the HF RF generator 104 at the HF offset value HF0.5 during the bin 6. Upon operating the HF RF generator 104 at the HF offset value HF0.5 during the bin 6 of the cycle (n–m) and receiving the parameter during the bin 6 of the cycle (n–m), the processor 114 determines that the parameter has a lower value during the cycle (n–m) compared to a value of the parameter received during the cycle (n–m–p) of the voltage signal 212. The value of the parameter during the cycle (n–m–p) is determined by the processor 114 when the processor 114 controls the HF RF generator 104 to operate at the HF offset value HF(0.75) by applying another multiplier M2' instead of the multiplier M2. In this manner, the processor 114 determines that a value of the parameter for the cycle (n–m) is lower than a value of the parameter for the cycle (n–m–p), and therefore, determines to operate the HF RF generator 104 at the HF offset values HF0.5, HF1, HF1.5, HF1, and HF0.5 based on the multiplier M2 instead of the multiplier M2'.

In addition, the processor 114 modifies the multiplier M2 with a change in the plasma condition. For example, with an increase in a ratio of power of operation of the LF RF generator 102 and power of operation of the HF RF generator 104, there is an increase in a value of the multiplier M2. With a decrease in the ratio of power of operation of the LF RF generator 102 and power of operation of the HF RF generator 104, there is a decrease in the value of the multiplier M2.

By applying the multiplier M2 to the bins 6 through 10, there is no need to determine or measure the high frequency reflected power to reduce the high frequency reflected power for the bins 7 through 10. For example, during the time interval of each bin 7 through 10, the processor 114 does not adjust corresponding offsetting values, such as the fifth and sixth offsetting values, to be applied to the reference high frequency value HF0 based on the high frequency reflected power. Rather, the same multiplier M2 is applied to the corresponding offsetting values during the bins 7 through 10 as that applied to the fourth offsetting value during the bin 6. This increases efficiency in processing the substrate S.

In this manner, by applying a multiplier, efficiency in processing the substrate S is achieved by the processor 114. For example, instead of determining nine different HF offset values for the bins 1 through 4 and 6 through 10, the multipliers –M1 and M2 are determined and are applied to the reference high frequency value HF0 in a manner described above. This increases speed of application of the HF offset values in processing the substrate S.

It should be noted that an offsetting value is an offset, such as a frequency value, from the reference high frequency value HF0. For example, the first offsetting value is determined by the processor 114 by subtracting a first frequency value from the reference high frequency value HF0. As another example, the fourth offsetting value is determined by the processor 114 by adding a second frequency value from the reference high frequency value HF0. To illustrate, the first and second frequency values are stored in the memory device 116 for access by the processor 114.

In an embodiment, the high frequency reflected power is reduced during any of the bins 1 through 3 of the cycle n or during any the bins 7 through 10 of the cycle n or a combination thereof. A number of any of the bins 1 through 3 or any of the bins 7 through 10 or a combination thereof is an example of a pre-set number of the bins. For example, the parameter is determined by the processor 114 for any of the bins 1 through 3 in the same manner in which the parameter is determined for the bin 4. To illustrate, the processor 114 determines the parameter for the bin 1 based on the voltage values of the voltage signal 212 during the bin 1. The processor 114 determines an HF offset value of operation of the HF RF generator 104 for the bin 1 to reduce, such as minimize, the parameter associated with the HF RF generator 104 for the bin 1. For example, when the HF RF generator 104 is operated at a first HF offset value during the bin 1 of the cycle (n–m–p), a first value of the reflection coefficient is determined by the processor 114 based on a first value of the voltage signal 212. Also, when the HF RF generator 104 is operated at a second HF offset value during the bin 1 of the cycle (n–m), a second value of the reflection coefficient is determined by the processor 114 based on a second value of the voltage signal 212. The processor 114 determines that the second value of the reflection coefficient is less that the first value of the reflection coefficient, and therefore, determines to operate the HF RF generator 104 at the second HF offset value during the bin 1 of the cycle n. Instead of operating the HF RF generator 104 to have the HF offset value HF(–2) based on the multiplier –M1 during the bin 1 of the cycle n, the HF RF generator 104 is controlled to operate at the second HF offset value that reduces the parameter associated with the HF RF generator 104. The high frequency value HF0 is modified according to the second HF offset value by the processor 114 to control the HF RF generator 104 according to the second HF offset value. The processor 114 controls the HF RF generator 104 to operate at the second HF offset value during the time period for the bin 1 of the cycle n. For example, the recipe signal 144 (FIG. 1) includes the second HF offset value as corresponding to the bin 1.

FIG. 3B is an embodiment of a graph 310 to illustrate that different presets are applied to reduce the high frequency reflected power instead of controlling the HF RF generator 104 to apply the multipliers –M1 and M2 during processing of the substrate S. The graph 300 plots HF offset values of the HF RF generator 104 versus the time t. The HF offset values are plotted on a y-axis, which is the same as the y-axis of the graph 300 (FIG. 3A) and the time t is plotted on an x-axis, which is the same as the x-axis of the graph 300. For example, instead of applying the frequency signal 302, a first preset indicated by a frequency signal 352 or a second preset indicated by a frequency signal 354 is applied by the processor 114 to efficiently reduce the high frequency reflected power. The processor 114 determines, based on the voltage signal 212, that the parameter for one of the bins 1 through 3 and the bins 7 through 10 is outside a predetermined range, which is stored in the memory device 116. Upon determining so, the processor 114 applies multipliers of the first preset or the second preset to the high frequency value HF0 for the bin 0. The multipliers of the first preset or the second preset are determined in the same manner by the processor 114 in which the multipliers –M1 and M2 are determined. The y-axis of the graph 310 has HF offset values ranging from HF(–6) through HF9. It should be noted that the HF offset values increase from HF6 to HF9 in a manner explained above.

The first and second presets are stored in the memory device 116 (FIG. 1) for access by the processor 114. The first preset is generated by the processor 114 by applying different multipliers, such as –M3 and M4, than the multipliers –M1 and M2 to the high frequency value HF0 in the same manner in which the multipliers –M1 and M2 are applied to the high frequency value HF0. For example, instead of multiplying the first offsetting value with the multiplier –M1, the first offsetting value is multiplied with the multiplier –M3 and instead of multiplying the fourth offsetting value with the multiplier M2, the fourth offsetting value is multiplied with the multiplier M4. The multipliers –M3 and M4 are examples of pre-stored multipliers that are generated by the processor 114 before the multipliers –M1 and M2 are generated. The multipliers –M3 and M4 are stored in the memory device 116 for access by the processor 114 to generate the first preset. Similarly, the second preset is generated by the processor 114 by applying different multipliers, such as –M5 and M6, than the multipliers –M1 and M2 to the high frequency value HF0 in the same manner in which the multipliers –M1 and M2 are applied to the high frequency value HF0. For example, instead of multiplying the first offsetting value with the multiplier –M1, the first offsetting value is multiplied with the multiplier –M5 and instead of multiplying the fourth offsetting value with the multiplier M2, the fourth offsetting value is multiplied with the multiplier M6. The multipliers –M5 and M6 are examples of pre-stored multipliers that are generated by the processor 114 before the multipliers –M1 and M2 are generated. The multipliers –M5 and M6 are stored in the memory device 116 for access by the processor 114 to generate the second preset.

Also, the first preset is applied for a different plasma condition 2 than a plasma condition 3 for which the second preset is generated. An example of a plasma condition is a ratio of power of operation of the LF RF generator 102 and a power of operation of the HF RF generator 104. To illustrate, the first preset is applied when a ratio of power of operation of the LF RF generator 102 and a power of operation of the HF RF generator 104 has a first value. The second preset is applied when a ratio of power of operation of the LF RF generator 102 and a power of operation of the HF RF generator 104 has a second value. The second value is different from the first value. To further illustrate, a power of operation of an RF generator, such as the LF RG generator 102 or the HF RF generator 104, represents a power level of an envelope of an RF signal generated by the RF generator. The envelope is a peak-to-peak amplitude or a zero-to-peak amplitude for a state of the RF signal. The frequency signal 302 is generated for a plasma condition 1.

The frequency signal 352 includes the HF offset value HF(–2.75) generated by the HF RF generator 104 during the bin 1 of the cycle n, the HF offset value HF(–1.75) generated by the HF RF generator 104 during the bin 2 of the cycle n, the HF offset value HF(–0.75) generated by the HF RF generator 104 during the bin 3 of the cycle n, and the HF offset value HF(–0.75) generated by the HF RF generator 104 during the bin 4 of the cycle n. Also, the frequency signal 352 includes the high frequency value HF0 generated by the HF RF generator 104 during the bin 5 of the cycle n, the HF offset value HF4 generated by the HF RF generator 104 during the bin 6 of the cycle n, the HF offset value HF6 generated by the HF RF generator 104 during the bin 7 of the cycle n, and the HF offset value HF8 generated by the HF RF generator 104 during the bin 8 of the cycle n. The frequency signal 352 includes the HF offset value HF4 generated by the HF RF generator 104 during the bin 9 of the cycle n, and the HF offset value HF2 generated by the HF RF generator 104 during the bin 10 of the cycle n. Because the value HF0 is generated by the HF RF generator 104 during the bin 0 of the cycle n, the bin 0 stays as the bin 0 for the frequency signal 352. HF offset values of remaining bins for the frequency signal 352 are determined by the processor 114 based on the high frequency value HF0 of the bin 0.

Also, the frequency signal 354 includes the HF offset value HF(1) generated by the HF RF generator 104 during the bin 1 of the cycle n, the HF offset value HF(–2) generated by the HF RF generator 104 during the bin 2 of the cycle n, the HF offset value HF(–4) generated by the HF RF generator 104 during the bin 3 of the cycle n, the HF offset value HF(–3) generated by the HF RF generator 104 during the bin 4 of the cycle n, the high frequency value HF0 generated by the HF RF generator during the bin 5 of the cycle n, the HF offset value HF(2) generated by the HF RF generator 104 during the bin 6 of the cycle n, the HF offset value HF3 generated by the HF RF generator 104 during the bin 7 of the cycle n, the HF offset value HF3 generated by the HF RF generator 104 during the bin 8 of the cycle n, the HF offset value HF2 generated by the HF RF generator 104 during the bin 9 of the cycle n, and the HF offset value HF1 generated by the HF RF generator 104 during the bin 10 of the cycle n. Because the value HF0 is generated by the HF RF generator 104 during the bin 0 of the cycle n, the bin 0 is also the bin 0' for the frequency signal 354. HF offset values of remaining bins for the frequency signal 354 are determined by the processor 114 based on the high frequency value HF0 of the bin 0.

Instead of using the parameter to determine the HF offset values during one or more of the bins 1 through 3 or during one or more of the bins 7 through 10 or a combination thereof to reduce the high frequency reflected power, the processor 114 obtains the first preset or the second preset from the memory device 116, and applies the HF offset values of the first preset or the second preset to the HF RF generator 104. For example, to apply the first preset during the bin 1 of the cycle n, the processor 114 controls the HF RF generator 104 to operate at the HF offset value HF(–2.75) instead of operating the HF RF generator 104 at the HF offset value HF(–2). As another example, to apply the second preset during the bin 3, the processor 114 controls the HF RF generator 104 to operate at the HF offset value HF(–3) during the bin 4 of the cycle n instead of operating the HF RF generator 104 at the HF offset value HF(–1). The first or second presets are applied during the cycle n. During the cycle (n–m) of the clock signal 202 before the cycle n, the first preset or the second preset or a combination thereof are determined.

The processor 114 controls the HF RF generator 104 to operate at the HF offset values of the first preset or the second preset. For example, the processor 114 sends the HF offset values of the first preset or the second preset within the recipe signal 144 (FIG. 1) via the transfer cable 120 to the HF RF generator 104. Upon receiving the HF offset values of the first preset or the second preset, the HF RF generator 104 generates the RF signal 152 to have the HF offset values of the first preset or the second preset.

In one embodiment, the first preset is generated based on the multiplier –M1 instead of the multiplier –M3 or the multiplier M2 instead of the multiplier M4.

In an embodiment, the second preset is generated based on the multiplier –M1 instead of the multiplier –M5 or the multiplier M2 instead of the multiplier M6.

FIG. 3C is a diagram of an embodiment of a graph 320 to illustrate that multiplier that is applied to the HF RF generator 104 is zero for a portion of the cycle n. The graph 320 plots HF offset values of the HF RF generator 104 (FIG. 1) versus the time t. The graph 320 includes a y-axis, which is the same as the y-axis of the graph 310 (FIG. 3B). The graph 320 further includes an x-axis, which the same as the x-axis of the graph 310.

The graph 320 includes a frequency signal 330, which is the same as the frequency signal 302 (FIG. 3A) except that during the negative cycle of the voltage signal 212 (FIG. 2B), the processor 114 (FIG. 1) controls the HF RF generator 104 (FIG. 1) to apply the multiplier of zero. For example, instead of controlling the HF RF generator 104 to reduce the high frequency reflected power, the processor 114 controls the HF RF generator 104 to have a zero HF offset value from the high frequency value HF0 during the bins 6 through 10. To illustrate, the processor 114 controls the HF RF generator 104 to have the zero HF offset value from the high frequency value HF0 during the bins 6 through 10. To further illustrate, the processor 114 sends the recipe signal 144 having the high frequency reference value HF0 during the bins 6 through 10. The high frequency reference value HF0 is generated for the bins 6 through 10 by multiplying corresponding offsetting values, such as the fourth through sixth offsetting values, for the bins 6 through 10 with the multiplier M2 as zero. The high frequency reference value HF0 is sent via the transfer cable 120 (FIG. 1) to the HF RF generator 104. When the multiplier M2 is zero, zero HF offset value is applied to the high frequency value HF0 is and therefore the high frequency value HF0 is indicated to the HF RF generator 104. The recipe signal 144 is sent to the HF RF generator 104 to operate the HF RF generator 104 at the zero HF offset value from the high frequency value HF0 during the bins 6 through 10 of the cycle n. Upon receiving the recipe signal 144, the HF RF generator 104 generates the RF signal 152 (FIG. 1) having the zero HF offset value from the high frequency value HF0 during the bins 6 through 10 of the cycle n.

As another example, instead of controlling the HF RF generator 104 to reduce the high frequency reflected power, the processor 114 controls the HF RF generator 104 to have the zero HF offset value from the high frequency value HF0 during the bins 1 through 4. To illustrate, the processor 114 sends the recipe signal 144 having the high frequency reference value HF0 during the bins 1 through 4. The high frequency reference value HF0 is generated for the bins 1 through 4 by multiplying corresponding offsetting values, such as the first through third offsetting values, for the bins 1 through 4 with the multiplier –M1 as zero. The high frequency reference value HF0 is sent via the transfer cable 120 to the HF RF generator 104. When the multiplier –M1 is zero, the zero HF offset value is applied to the high frequency value HF0 and so the high frequency value HF0 is indicated to the HF RF generator 104. The recipe signal 144 is sent to the HF RF generator 104 to operate the HF RF generator 104 at the zero HF offset value from the high frequency value HF0 during the bins 1 through 4 of the cycle n. Upon receiving the recipe signal 144, the HF RF generator 104 generates the RF signal 152 (FIG. 1) having the zero HF offset value from the high frequency value HF0 during the bins 1 through 4 of the cycle n. In this manner, the processor 114 controls the HF RF generator 104 to have the zero HF offset value from the high frequency value HF0 during the positive cycle of the voltage signal 212.

Controlling the HF RF generator 104 to have the zero HF offset value from the high frequency value HF0 using the multiplier of zero during a portion of the cycle n provides efficiency in controlling the high frequency values of the HF RF generator 104. For example, there is no need to determine the multiplier –M1 or M2 for which the high frequency reflected power is reduced.

In one embodiment, the processor 114 controls the HF RF generator 104 to have the zero HF offset value from the high frequency value HF0 during any portion of the cycle n, such as the bins 3 through 7, of the clock signal 202.

FIG. 4A is an embodiment of a graph 400 to illustrate a clock signal 402. The clock signal 402 different from the clock signal 202 (FIG. 2A), described above. An x-axis of the graph 400 plots the time t ranging from the time to to a time t160. A y-axis of the graph 400 plots a voltage of the clock signal 402. The clock signal 402 is generated by the processor 114 (FIG. 1).

The clock signal 402 transitions periodically between the logic level 1 and the logic level 0. The clock signal 402 transitions from the logic level 0 to the logic level 1 at the time t0 and remains at the logic level 1 from the time to to the time t40. At the time t40, the clock signal 402 transitions from the logic level 1 to the logic level 0, and remains at the logic level 0 from the time t40 to the time t80. The transitions between the logic levels 1 and 0 repeat from the time t80 to the time t160. The transitions between the logic levels 1 and 0 of the clock signal 402 are generated by the processor 114 and provided within the recipe signal 142 (FIG. 1) to the LF RF generator 102.

FIG. 4B is an embodiment of a graph 420 to illustrate power of an RF signal 422 that is generated by the LF RF generator 102 (FIG. 1). The RF signal 422 is an example of the RF signal 150 (FIG. 1) generated and supplied by the LF RF generator 102. The graph 420 plots an envelope 424 of power of the RF signal 422 versus the time t. The time t is plotted on an x-axis, which is the same as the x-axis of the graph 400 (FIG. 4A). The envelope 424 is plotted with reference to a y-axis of the graph 420. The y-axis plots power amounts ranging from –P6 to zero and from zero to P6. It should be noted that the power amounts increase from –P6 to P6. For example, the power amount –P5 is greater than the power amount –P6 and the power amount –P5 is greater than the power amount –P4 and so on.

The envelope 424 is of power of the RF signal 422. For example, the envelope 424 is a peak-to-peak amplitude of the power of the RF signal 422. The envelope 424 transitions periodically, in synchronization with the clock signal 402, between a state S1 of the RF signal 422 and a state S0 of the RF signal 422. For example, the envelope 424 transitions from the power level P3 to the power level P6 and from the power level –P3 to the power level –P6 at the time t0 and remains at the power levels P6 and –P6 from the time to to the time t40. The power levels P6 and –P6 represent the state S1 of the RF signal 422. The envelope 424 transitions from the power level P6 to the power level P3 and from the power level –P6 to the power level –P3 during a time period from the time t36 to the time t40 to form a transition state TS1 of the RF signal 422. The envelope 424 remains at the power levels P3 and –P3 from the time t40 to the time t80 to form the state S0 of the RF signal 422. The envelope 424 transitions from the power level P3 to the power level P6 and from the power level –P3 to the power level –P6 during a time period from the time t76 to the time t80 to form a transition state TS2 of the RF signal 422. In this manner, the power levels P6 and –P6 and P3 and –P3 repeat from the time t80 to the time t160. Also, a power level of the RF signal 422 represents a state, such as the S1 or the state S0, of the RF signal 422. The transitions between the logic levels 1 and 0 of the clock signal 402 are generated by the processor 114 and provided within the recipe signal 142 (FIG. 1) to the LF RF generator 102 to facilitate the RF signal 422 to transition synchronously with the clock signal 402.

Steady states of the RF signal 422 occur during time periods in which the RF signal 422 does not transition from one state to another and the transition states of the RF signal 422 occur during timer periods in which the RF signal 422 transitions from one state to another. For example, a first steady state is the state S1 of the RF signal 422 and a second steady state is the state S0 of the RF signal 422. The state S1 occurs during a first time period from the time to to the time t36 and the state S0 occurs during a second time period from the time t40 to the time t76. Each of the first and second time periods is a tuning window. As an example, the first transition state TS1 is a state of the RF signal 422 during a time period from the time t36 to the time t40 and the second transition state TS2 is a state of the RF signal 422 during a time period from the time t76 to the time t80. In the first transition state, the RF signal 422 transitions from the state S1 to the state S0 and in the second transition state, the RF signal 422 transitions from the state S0 to the state S1. As an example, during a transition state, power values of the RF signal 422 change more frequently compared to change in power values of RF signal 422 during a steady state. Also, as another example, during a transition state, a positive slope or a negative slope due to a change in a power level of a state of the RF signal 422 is created. During a steady state, a slope of a power level is substantially zero or zero.

In one embodiment, instead of the RF signal 422, another RF signal generated by the HF RF generator 104 (FIG. 1) is used. The other RF signal is an example of the RF signal 152 (FIG. 1) generated by the HF RF generator 104. The other RF signal transitions from a state S1 to a state S0 and from the state S0 to the state S1 synchronous with the clock signal 402 in the same manner in which the RF signal 422 transitions between the states S1 and S0. During the state S1, the other RF signal has a greater power level compared to a power level of the other RF signal during the state S0. The transitions between the logic levels 1 and 0 of the clock signal 402 are generated by the processor 114 and provided within the recipe signal 144 (FIG. 1) to the HF RF generator 104 to facilitate the other RF signal to transition synchronously with the clock signal 402.

In an embodiment, both the RF signals 150 and 152 transition periodically between their corresponding states S1 and S0 synchronous with the clock signal 402.

FIG. 4C is an embodiment of a graph 430 to illustrate that multipliers are applied to the offsetting values to determine the HF offset values of the HF RF generator 104 (FIG. 1) during a hold-off period and are applied during a frequency tuning period. The hold-off period is illustrated by oblique lines in the graph 420 (FIG. 4B). The graph 430 plots the HF offset values with respect to the high frequency value HF0 of the HF RF generator 104 versus the time t. The HF offset values of the HF RF generator 104 are plotted on a y-axis, which is the same as the y-axis of the graph 300 (FIG. 3A). The time t is plotted on an x-axis, which is the same as the x-axis of the graph 300.

The processor 114 controls the HF RF generator 104 to operate at the HF offset values from the high frequency value HF0 during the steady states, such as the states S1 and S0, of the RF signal 422 (FIG. 4B) and to operate at the HF offset values from the high frequency value HF0 during the transition states TS1 and TS2 of the RF signal 422. The multipliers are also applied during the transition states TS1 and TS2. For example, the processor 114 sends, to the HF RF generator 104, the recipe signal 144 including time periods for the steady states of the RF signal 422 to be generated, time periods for the transition states TS1 and TS2 of the RF signal 422, the HF offset values of the frequency signal 302 during the steady state S1, the HF offset values of a frequency signal 432 during the steady state S0, the HF offset values of the frequency signal 302 during the first transition state TS1, and the HF offset values of the frequency signal 432 during the second transition state TS2. The transition states TS1 and TS2, and the frequency signal 432 are described below.

The processor 114 controls the HF RF generator 104 to have the HF offset values as illustrated by the frequency signal 302 during the state S1 and controls the HF RF generator 104 to have the HF offset values of the frequency signal 302 during the transition state TS1. For example, during the transition state TS1, the processor 114 controls the frequency of operation of the HF RF generator 104 to have the HF offset values of the frequency signal 302 during the transition state TS1.

The processor 114 controls the HF RF generator 104 to have the HF offset values as illustrated by the frequency signal 432 during the state S0 of the RF signal 422 and controls the HF RF generator 104 to have the HF offset values of the frequency signal 432 during the transition state TS2. For example, during the transition state TS2, the processor 114 controls the frequency of operation of the HF RF generator 104 to have the HF offset values of the frequency signal 432 during the transition state TS2. The processor 114 controls the HF RF generator 104 to have the HF offset values of the frequency signal 432 in the same manner in which the processor 114 controls the HF RF generator 104 to have the HF offset values of the frequency signal 302.

Also, the processor 114 controls the HF RF generator 104 to have the HF offset values from the high frequency value HF0 based on a first set of multipliers during the state S1 and the transition state TS1 of the RF signal 422 and to have the HF offset values from the high frequency value HF0 based on a second set of multipliers during the state S0 and the transition state TS2 of the RF signal 422. At least one multiplier of the first set is different from at least one multiplier of the second set. For example, the multipliers –M1 and M2 are used during the steady state S1 and the transition state TS1 of the RF signal 422 and multipliers –M7 and M8 are used during the steady state S0 and the transition state TS2 of the RF signal 422. The processor 114 applies the multipliers –M7 and M8 and operates the HF RF generator 114 based on the multipliers –M7 and M8 during the state S0 and the transition state TS2 of the RF signal 422 in the same manner in which the processor 114 applies the multipliers –M1 and M2 and operates the HF RF generator 114 based on the multipliers –M1 and M2 during the state S1 and the transition state TS1 of the RF signal 422. For example, the multipliers –M7 and M8 are applied to determine the HF offset values of the frequency signal 432.

However, during the transition states TS1 and TS2, the multipliers –M1, M2, –M7, and M8 are not determined based on the parameter. For example, during the transition state TS1, the processor 114 does not determine the multiplier –M1 to reduce, such as minimize, the parameter associated with the HF RF generator 104 for the bin 4. As another example, during the transition state TS1, the processor 114 does not determine the multiplier M2 to reduce the parameter associated with the HF RF generator 104 for the bin 6. Rather, the same multipliers –M1 and M2 determined for the steady state S1 are used for the transition state S1. As yet another example, during the transition state TS2, the processor 114 does not determine the multiplier –M7 to reduce the parameter associated with the HF RF generator 104 for the bin 4. As another example, during the transition state TS2, the processor 114 does not determine the multiplier M8 to reduce the parameter associated with the HF RF generator 104 for the bin 6. Rather, the same multipliers –M7 and M8 determined for the steady state S0 are used for the transition state TS2.

During the transition states of the RF signal 422, the processor 114 tunes or apply frequencies of the HF RF generator 104. For example, during the transition states of the RF signal 422, the processor 114 implements a combination of bin frequency tuning and pyramid tuning during the transition states of the RF signal 422 to reduce the high frequency reflected power. To illustrate, during the transition states, the processor 114 controls the HF RF generator 104 to tune or apply the offsetting values to implement the pyramid tuning. To illustrate, while the RF signal 422 transitions from one steady state to another steady state, the processor 114 controls the HF RF generator 104 to modify the offsetting values during the bins 1 through 4 and 6 through 10 to apply the pyramid tuning. The offsetting values, if modified, for the bins 1 through 4 and 6 through 10 are modified to reduce the parameter during the bins. As another example, during the transition states of the RF signal 422, the processor 114 controls the HF RF generator 104 to operate at the HF offset values determined based on any multiplier, described herein.

In one embodiment, the processor 114 applies the multipliers –M7 and M8 instead of the multipliers –M1 and M2 during the transition state TS1, and operates the HF RF generator 114 based on the multipliers –M7 and M8 during the transition state TS1.

In an embodiment, processor 114 applies the multipliers –M1 and M2 instead of the multipliers –M7 and M8 during the transition state TS2, and operates the HF RF generator 114 based on the multipliers –M1 and M2 during the transition state TS2.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, a plasma system, described herein, includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, or any other semiconductor processing chamber that is associated or used in fabrication and/or manufacturing of semiconductor wafers.

It is further noted that although the above-described operations are described with reference to a parallel plate plasma chamber, e.g., a CCP chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an X MHz RF generator, a Y MHz RF generator, and a Z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for reducing reflected radio frequency (RF) power, comprising:
   receiving a voltage signal from an output of a match coupled to a low frequency (LF) RF generator and a high frequency (HF) RF generator;
   dividing the voltage signal into a plurality of bins;
   identifying a first bin from the plurality of bins that includes a zero crossing, wherein the first bin is associated with a frequency of an HF RF signal generated by the HF RF generator;
   applying a first fixed multiplier to the frequency of the HF RF signal to generate a first plurality of negative offsets;
   applying a second fixed multiplier to the frequency of the HF RF signal to generate a first plurality of positive offsets;
   operating the HF RF generator according to the first plurality of negative offsets during a time period in which the voltage signal is positive; and
   operating the HF RF generator according to the first plurality of positive offsets during a time period in which the voltage signal is negative.

2. The method of claim 1, further comprising:
   receiving a parameter indicating an amount of power reflected towards the HF RF generator for a second bin from the plurality of bins;
   determining the first fixed multiplier based on the parameter.

3. The method of claim 1, further comprising:
   receiving a parameter indicating an amount of power reflected towards the HF RF generator for a second bin from the plurality of bins;
   determining the second fixed multiplier based on the parameter to output a changed frequency.

4. The method of claim 1, further comprising:
   identifying a pre-stored multiplier upon determining that a parameter is outside a predetermined range for a second bin from the plurality of bins;
   applying the pre-stored multiplier instead of the first fixed multiplier to the frequency associated with the first bin to generate a second plurality of negative offsets;

operating the HF RF generator according to the second plurality of negative offsets during a time period in which the voltage signal is positive.

5. The method of claim 1, further comprising:

identifying a pre-stored multiplier upon determining that a parameter is outside a predetermined range for a second bin from the plurality of bins;

applying the pre-stored multiplier instead of the second fixed multiplier to the frequency associated with the first bin to generate a second plurality of positive offsets;

operating the HF RF generator according to the second plurality of positive offsets during a time period in which the voltage signal is negative.

6. The method of claim 1, wherein the first fixed multiplier or the second fixed multiplier is zero.

7. The method of claim 1, wherein said operating the HF RF generator according to the first plurality of negative offsets and said operating the HF RF generator according to the first plurality of positive offsets occur during a time period for a steady state of the HF RF signal.

8. The method of claim 1, wherein said operating the HF RF generator according to the first plurality of negative offsets and said operating the HF RF generator according to the first plurality of positive offsets occurs during a time period for a state transition of an LF RF signal generated by the LF RF generator.

9. The method of claim 1, wherein at least one of the first multiplier and the second multiplier for a first state of an LF RF signal generated by the LF RF generator is different from at least one of a third multiplier and a fourth multiplier for a second state of the LF RF signal.

10. A controller for reducing reflected radio frequency (RF) power, comprising:

a processor configured to:

receive a voltage signal from an output of a match coupled to a low frequency (LF) RF generator and a high frequency (HF) RF generator;

divide the voltage signal into a plurality of bins;

identify a first bin from the plurality of bins that includes a zero crossing, wherein first bin is associated with a frequency of an HF RF signal generated by the HF RF generator;

apply a first fixed multiplier to the frequency of the HF RF signal to generate a first plurality of negative offsets;

apply a second fixed multiplier to the frequency of the HF RF signal to generate a first plurality of positive offsets;

operate the HF RF generator according to the first plurality of negative offsets during a time period in which the voltage signal is positive; and operate the HF RF generator according to the first plurality of positive offsets during a time period in which the voltage signal is negative; and a memory device coupled to the processor.

11. The controller of claim 10, wherein the processor is configured to:

receive a parameter indicating an amount of power reflected towards the HF RF generator for a second bin from the plurality of bins;

determine the first fixed multiplier based on the parameter.

12. The controller of claim 10, wherein the processor is configured to:

receive a parameter indicating an amount of power reflected towards the HF RF generator for a second bin from the plurality of bins;

determine the second fixed multiplier based on the parameter.

13. The controller of claim 10, wherein the processor is configured to:

identify a pre-stored multiplier upon determining that a parameter is outside a predetermined range for a second bin from the plurality of bins;

apply the pre-stored multiplier instead of the first fixed multiplier to the frequency associated with the first bin to generate a second plurality of negative offsets;

operate the HF RF generator according to the second plurality of negative offsets during a time period in which the voltage signal is positive.

14. The controller of claim 10, wherein the processor is configured to:

identify a pre-stored multiplier upon determining that a parameter is outside a predetermined range for a second bin from the plurality of bins;

apply the pre-stored multiplier instead of the second fixed multiplier to the frequency associated with the first bin to generate a second plurality of positive offsets;

operate the HF RF generator according to the second plurality of positive offsets during a time period in which the voltage signal is negative.

15. The controller of claim 10, wherein the first fixed multiplier or the second fixed multiplier is zero.

16. The controller of claim 10, wherein the HF RF generator is operated according to the first plurality of negative offsets and according to the first plurality of positive offsets during a time period for a steady state of the HF RF signal.

17. The controller of claim 10, wherein the HF RF generator is operated according to the first plurality of negative offsets and according to the first plurality of positive offsets during a time period for a state transition of the HF RF signal.

18. The controller of claim 10, wherein at least one of the first multiplier and the second multiplier for a first state of an LF RF signal is different from at least one of a third multiplier and a fourth multiplier for a second state of the LF RF signal.

19. A plasma system for reducing reflected radio frequency (RF) power, comprising:

a low frequency (LF) RF generator configured to generate an LF RF signal;

a high frequency (HF) RF generator configured to generate an HF RF signal;

a match coupled to the LF RF generator and the HF RF generator, wherein the match is configured to receive the LF RF and HF RF signals to output a modified RF signal;

a controller coupled to the LF RF generator, the HF RF generator, and the match, wherein the controller is configured to:

receive a voltage signal from an output of the match;

divide the voltage signal into a plurality of bins;

identify a bin from the plurality of bins that includes a zero crossing, wherein the bin is associated with a frequency of the HF RF signal generated by the HF RF generator;

apply a first fixed multiplier to the frequency of the HF RF signal to generate a plurality of negative offsets;

apply a second fixed multiplier to the frequency of the HF RF signal to generate a plurality of positive offsets;

operate the HF RF generator according to the plurality of negative offsets during a time period in which the voltage signal is positive; and operate the HF RF generator according to the plurality of positive offsets during a time period in which the voltage signal is negative.

20. The plasma system of claim 19, wherein the HF RF generator is operated according to the plurality of negative offsets and according to the plurality of positive offsets during a time period for a steady state of the LF RF signal, wherein the HF RF generator is operated according to the plurality of negative offsets and according to the plurality of positive offsets during a time period for a state transition of the LF RF signal.

* * * * *